US009804330B1

(12) United States Patent
Nagao et al.

(10) Patent No.: US 9,804,330 B1
(45) Date of Patent: Oct. 31, 2017

(54) SEMICONDUCTOR DEVICE

(71) Applicant: Mitsubishi Electric Corporation, Tokyo (JP)

(72) Inventors: Ryosuke Nagao, Tokyo (JP); Yoshifumi Sasahata, Tokyo (JP); Eitaro Ishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/401,311

(22) Filed: Jan. 9, 2017

(30) Foreign Application Priority Data

Jun. 28, 2016 (JP) .................................. 2016-127707

(51) Int. Cl.
*H01S 5/40* (2006.01)
*G02B 6/125* (2006.01)
*G02B 6/293* (2006.01)
*G02B 6/12* (2006.01)
*H01S 5/0625* (2006.01)

(52) U.S. Cl.
CPC ......... *G02B 6/125* (2013.01); *G02B 6/12004* (2013.01); *G02B 6/2938* (2013.01); *G02B 6/29344* (2013.01); *H01S 5/4056* (2013.01); *H01S 5/4087* (2013.01); *G02B 2006/12035* (2013.01); *G02B 2006/12121* (2013.01); *H01S 5/06256* (2013.01); *H01S 5/4031* (2013.01)

(58) Field of Classification Search
None
See application file for complete search history.

(56) References Cited

U.S. PATENT DOCUMENTS

| 5,394,489 A * | 2/1995 | Koch | G02B 6/12004 |
|---|---|---|---|
| | | | 257/E27.128 |
| 6,275,317 B1 * | 8/2001 | Doerr | H04B 10/505 |
| | | | 398/183 |
| 7,424,041 B2 * | 9/2008 | Meliga | B82Y 20/00 |
| | | | 372/20 |
| 2002/0064333 A1 * | 5/2002 | Shigeta | H01S 5/02216 |
| | | | 385/14 |

(Continued)

FOREIGN PATENT DOCUMENTS

| JP | 2003-258368 A | 9/2003 |
|---|---|---|
| JP | 2015-122352 A | 7/2015 |

*Primary Examiner* — Michelle R Connelly
(74) *Attorney, Agent, or Firm* — Studebaker & Brackett PC

(57) ABSTRACT

According to the present invention, a semiconductor device includes a substrate comprising a front end face, a rear end face and side faces, a plurality of semiconductor lasers provided on the substrate, a forward optical multiplexer to multiplex forward output light of the plurality of semiconductor lasers and output the multiplexed light to the front end face, a backward optical multiplexer to multiplex backward output light of the plurality of semiconductor lasers and output the multiplexed light to the rear end face and a plurality of backward waveguides connected to an output section of the backward optical multiplexer, wherein the plurality of backward waveguides includes a main waveguide disposed at a center of the output section and a plurality of lateral waveguides disposed on both sides of the main waveguide to bend toward the side faces and output light from the side faces diagonally to the side faces.

7 Claims, 4 Drawing Sheets

(56) References Cited

U.S. PATENT DOCUMENTS

| | | | |
|---|---|---|---|
| 2004/0067006 A1* | 4/2004 | Welch | B82Y 20/00 385/14 |
| 2005/0243874 A1* | 11/2005 | Paoletti | B82Y 20/00 372/20 |
| 2006/0203858 A1* | 9/2006 | Arimoto | H01S 5/0265 372/20 |
| 2009/0202196 A1* | 8/2009 | Kish, Jr. | B82Y 20/00 385/14 |
| 2012/0027041 A1* | 2/2012 | Yamazaki | G02B 6/12004 372/50.12 |
| 2015/0043000 A1* | 2/2015 | Mochizuki | G01J 1/4257 356/454 |

* cited by examiner

SEMICONDUCTOR DEVICE

BACKGROUND OF THE INVENTION

Field

The present invention relates to a semiconductor device used as a variable wavelength light source.

Background

Japanese laid-open patent publication No. 2003-258368 discloses a variable wavelength light source mounted with a semiconductor laser. This variable wavelength light source is provided with lateral waveguides to propagate stray light which is unnecessary tight on both sides of a central waveguide through which signal light propagates. Stray light is emitted from the lateral waveguides and it is thereby possible to prevent stray light from being emitted from the central waveguide.

In the variable wavelength light source disclosed in Japanese laid-open patent publication No. 2003-258368, signal light and stray light are emitted from an emission end face. For this reason, when signal light is used by causing it to enter a photodiode, stray light may enter the photodiode. Therefore, the arrangement of the photodiode is limited to prevent the photodiode from receiving the stray light.

SUMMARY

The present invention has been implemented to solve the above-described problem, and it is an object of the present invention to provide a semiconductor device capable of improving a degree of freedom of the arrangement of a photodiode.

The features and advantages of the present invention may be summarized as follows.

According to the present invention, a semiconductor device includes a substrate comprising a front end face, a rear end face and side faces disposed on both sides of the front end face and the rear end face, a plurality of semiconductor lasers provided on the substrate, a forward optical multiplexer provided on the substrate to multiplex forward output light of the plurality of semiconductor lasers and output the multiplexed light to the front end face, a backward optical multiplexer provided on the substrate to multiplex backward output light of the plurality of semiconductor lasers and output the multiplexed light to the rear end face and a plurality of backward waveguides provided on the substrate and connected to an output section of the backward optical multiplexer, wherein the plurality of backward waveguides includes a main waveguide disposed at a center of the output section and a plurality of lateral waveguides disposed on both sides of the main waveguide to bend toward the side faces and output light from the side faces diagonally to the side faces.

Other and further objects, features and advantages of the invention will appear more fully from the following description,

DESCRIPTION OF EMBODIMENTS

Figure 1:
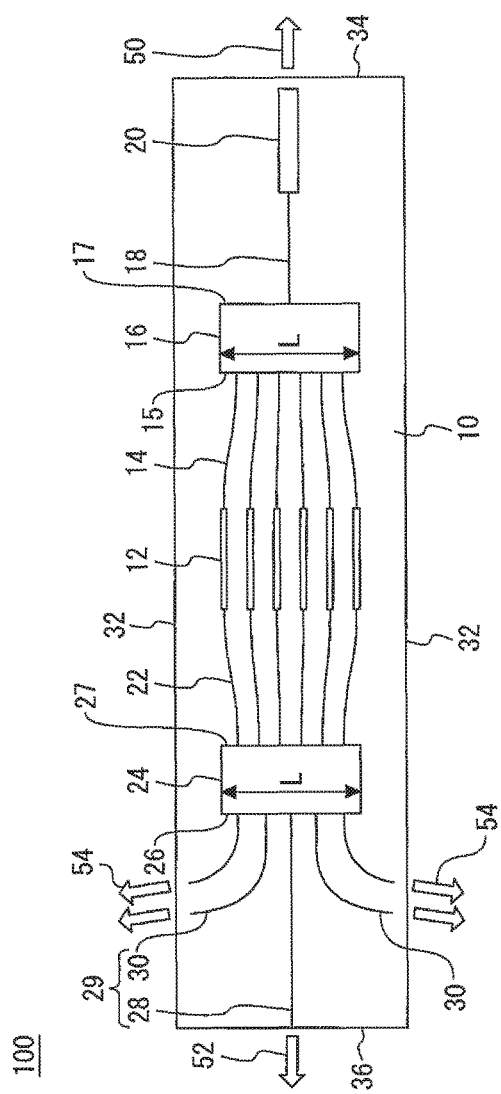
FIG. 1 is a plan view of a semiconductor device according to a first embodiment of the present invention.

A semiconductor device according to an embodiment of the present invention will be described with reference to the accompanying drawings. Components identical or corresponding to each other are indicated by the same reference characters, and repeated description of them is avoided in some cases.

Embodiment 1

FIG. 1 is a plan view of a semiconductor device according to a first embodiment of the present invention, A semiconductor device 100 according to the present embodiment is provided with a substrate 10. The substrate 10 is provided with 16 semiconductor lasers 12. Note that in FIG. 1, some of the semiconductor lasers 12 are not shown for convenience. The semiconductor lasers 12 are DFB-LDs (distributed feedback laser diodes). The 16 semiconductor lasers 12 constitute a DFB-LD array. The 16 semiconductor lasers 12 each oscillate in a single mode with different wavelengths. Although the present embodiment is provided with 16 semiconductor lasers 12, the number of semiconductor lasers 12 is not limited as long as it is plural.

One end of a first waveguide 14 is connected to a forward output end of each semiconductor laser 12. The first waveguide 14 propagates forward output light of the semiconductor laser 12. The other end of the first waveguide 14 is inputted to an input section 15 of a forward optical multiplexer 16. The forward optical multiplexer 16 multiplexes forward output light of the semiconductor lasers 12 and outputs the multiplexed light toward a front end face 34 of the substrate 10. The forward optical multiplexer 16 outputs light from an output port provided for an output section 17. The forward optical multiplexer 16 is an MMI (multimode interference) type optical multiplexer. The forward optical multiplexer 16 is of a 16×1-MMI type having one output port for 16 inputs from the first waveguides 14.

One end of one second waveguide 18 is connected to the output port of the output section 17 of the forward optical multiplexer 16. The second waveguide 18 has a linear shape. The other end of the second waveguide 18 is connected to a light amplifier 20. The light amplifier 20 is an SOA (semiconductor optical amplifier). Light amplified by the light amplifier 20 is outputted from the front end face 34 of the substrate 10 as signal light 50. As described above, the semiconductor device 100 is provided with a function as a variable wavelength light source capable of outputting signal light 50 having a plurality of wavelengths.

One end of a third waveguide 22 is connected to a rear output end of each semiconductor laser 12. The third waveguide 22 propagates backward output light of the semiconductor laser 12. The other end of the third waveguide 22 is inputted to an input section 27 of a backward optical multiplexer 24. The backward optical multiplexer 24 multiplexes backward output light of the semiconductor lasers 12 and outputs the multiplexed light toward a rear end face 36 of the substrate 10, The backward optical multiplexer 24 outputs light from an output port provided for an output section 26. The backward optical multiplexer 24 is an MMI type optical multiplexer.

The output section 26 is provided with five output ports. The output ports are arranged on the output section 26 at equal intervals. One end of a backward waveguide 29 is connected to each output port. In the present embodiment, the semiconductor device 100 is provided with five backward waveguides 29. The backward optical multiplexer 24 is of a 16×5-MMI type with five output ports for 16 inputs from the third waveguides 22.

The five backward waveguides 29 include one main waveguide 28 and four lateral waveguides 30. The main waveguide 28 is disposed at a center of the output section 26. The main waveguide 28 has a linear shape. The other end of the main waveguide 28 is connected perpendicularly to the rear end face 36 which is a surface opposite to the output section 26 of the substrate 10. The main waveguide 28 propagates monitoring light 52 for monitoring the signal light 50. The monitoring light 52 has the same wavelength as that of the signal light 50. The main waveguide 28 outputs the monitoring light 52 from the rear end face 36.

A photodiode (not shown) is disposed outside the substrate 10. The photodiode is disposed at a position where it can receive the monitoring light 52 in the vicinity of the rear end face 36. The photodiode detects intensity of the monitoring light 52. Therefore, the photodiode receives the monitoring light 52 and can thereby monitor emission light from the semiconductor lasers 12. Therefore, the semiconductor device 100 is provided with a wavelength monitoring function that monitors the signal light 50. Furthermore, an optical filter (not shown) is disposed between the rear end face 36 and the photodiode. Transmittance of the optical filter has a periodic dependency on frequency. The optical filter is provided in such a way as to facilitate transmission of light having the frequency of signal light 50.

The four lateral waveguides 30 are arranged on each of both sides of the main waveguide 28 in the same number. That is, two lateral waveguides 30 are arranged on each of both sides of the main waveguide 28. The four lateral waveguides 30 are bent toward side faces 32 on both sides of the substrate 10. Here, the side faces 32 are surfaces parallel to the main waveguide 28 and arranged on both sides of the front end face 34 and the rear end face 36. Of the four lateral waveguides 30, two lateral waveguides arranged on one side of the main waveguide 28 and two lateral waveguides arranged on the other side are bent in opposite directions with respect to the main waveguide 28. That is, the four lateral waveguides 30 are each bent toward the side face 32 located closer so as not to cross the main waveguide 28.

The lateral waveguides 30 are bent waveguides. The lateral waveguide 30 preferably has a radius of curvature of 1000 μm to 1700 μm in consideration of the size of the semiconductor device 100. The lateral waveguide 30 may be formed of only a bent portion or may include a linear portion before and after the bent portion.

In addition to the monitoring light 52, stray light 54 is emitted from the backward optical multiplexer 24. The stray light 54 is light having a wavelength other than that of the monitoring light 52 and is light unnecessary for monitoring the signal light 50. The size of the backward optical multiplexer 24 is adjusted such that the stray fight 54 is emitted from the side part of the backward optical multiplexer 24. The lateral waveguide 30 is disposed on the side part of the output section 26. For this reason, the lateral waveguide 30 propagates the stray light 54. The lateral waveguide 30 outputs the stray light 54 from the side face 32 diagonally to the side face 32.

Furthermore, the semiconductor device 100 according to the present embodiment is provided with the five backward waveguides 29, but the number of backward waveguides 29 may be other than 5 as long as it is an odd number equal to or greater than 3. When the number of backward waveguides 29 is assumed to be N, one of the N backward waveguides 29 is the main waveguide 28. Therefore, (N−1)/2 lateral waveguides 30 are disposed on each of both sides of the main waveguide 28.

An arrangement of the first waveguides 14, the second waveguide 18, the third waveguides 22 and the backward waveguides 29 will be described below. The input sections 15 and 27 and the output sections 17 and 26 of the forward optical multiplexer 16 and the backward optical multiplexer 24 are each assumed to have a width of L. Furthermore, the number of the first waveguides 14 or the third waveguides 22 is assumed to be M. Note that M is a natural number of 2 or greater and is the same number as the number of the semiconductor lasers 12 provided for the semiconductor device 100. The number of the backward waveguides 29 is assumed to be N. Note that N is an odd number of 3 or greater.

The M third waveguides 22 are arranged at an interval of L/M symmetrically centered on the position of L/2 from an end of the input section 27 of the backward optical multiplexer 24. Similarly, the M first waveguides 14 are arranged symmetrically centered on the position of L/2 from an end of the input section 15 of the forward optical multiplexer 16 and at an interval of L/M. The N backward waveguides 29 are arranged symmetrically centered on the position of L/2 from the end of the output section 26 of the backward optical multiplexer 24 and at an interval of L/N. The main waveguide 28 of the backward waveguides 29 is arranged at a position of L/2 from the end of the output section 26. The second waveguide 18 is arranged at a position of L/2 from the end of the output section 17 of the forward optical multiplexer 16.

Figure 2:
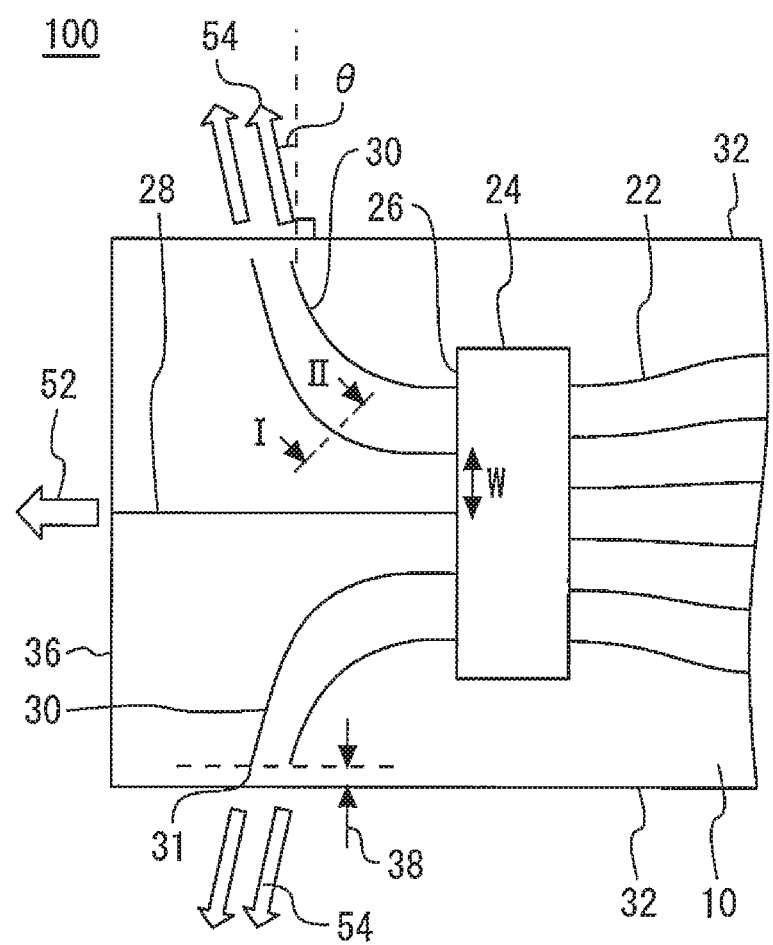
FIG. 2 is an enlarged view of the semiconductor device according to the first embodiment of the present invention.

FIG. 2 is an enlarged view of the semiconductor device according to the first embodiment of the present invention. FIG. 2 is an enlarged view of the lateral waveguide 30 of the semiconductor device 100. The lateral waveguide 30 outputs stray light 54 in a direction at an angle of θ with respect to the normal of the side face 32. The angle θ is preferably 7° or greater. Furthermore, as shown by an arrow 38, an output end 31 of the lateral waveguide 30 is arranged inside the side face 32. A spacing between the output end 31 of the lateral waveguide 30 and the side face 32 is preferably 10 μm to 30 μm considering a variation in accuracy when the semiconductor device 100 is separated into individual components. A spacing W which is equal to or greater than the width of output light of the backward optical multiplexer 24 is provided between the lateral waveguide 30 and the main waveguide 28. The width of the output light of the backward optical multiplexer 24 is a beam diameter of the output light of the backward optical multiplexer 24.

Figure 3:
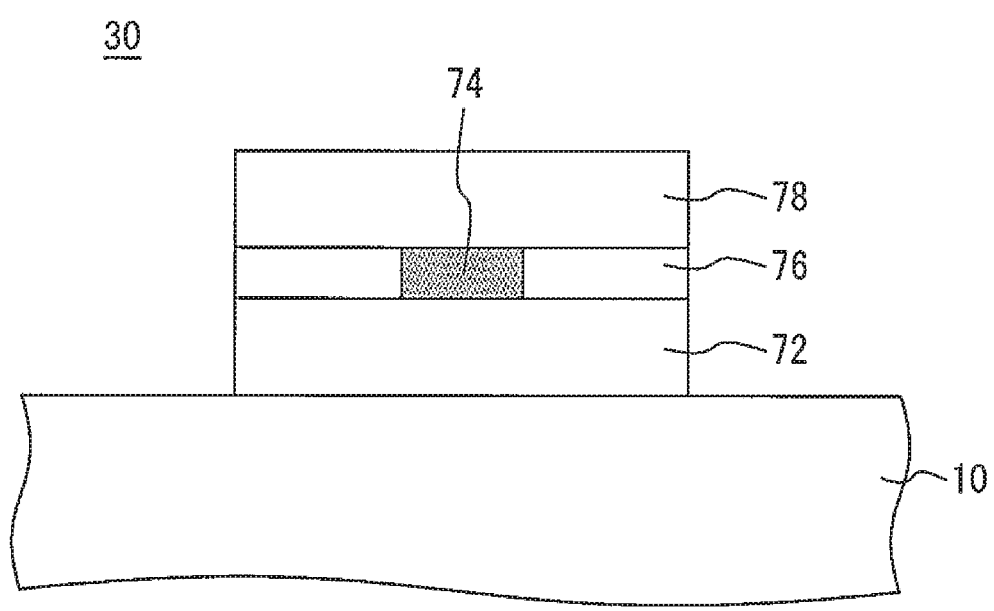
FIG. 3 is a cross-sectional view of the lateral waveguide according to the first embodiment of the present invention.

FIG. 3 is a cross-sectional view of the lateral waveguide according to the first embodiment of the present invention. FIG. 3 is a cross-sectional view obtained by cutting FIG. 2 along a straight line I-II. The substrate 10 in the present embodiment contains InP. A lower clad layer 72 containing InP is disposed on the substrate 10. A light absorption layer 74 containing InGaAsP is disposed on the lower clad layer 72. The light absorption layer 74 is designed so as to absorb the stray light 54, In the semiconductor device manufacturing method according to the present embodiment, the light absorption layer 74 and an active layer of the main waveguide 28 are formed in an identical step. Furthermore, a current block layer 76 containing InP is disposed on both sides of the light absorption layer 74 on the lower clad layer 72. An upper clad layer 78 containing InP is disposed on the light absorption layer 74 and the current block layer 76. The lateral waveguide 30 is formed in this way.

For variable wavelength light sources, a wavelength of signal light is preferably stable for a long period of time. In this case, a function of a wavelength monitor for monitoring emission light from a semiconductor laser may be required. With the semiconductor device 100 according to the present embodiment, the monitoring light 52 is received by a photodiode and it is thereby possible to monitor emission light from the semiconductor laser 12. Here, when stray light enters the photodiode, the monitoring wavelength fluctuates. Therefore, monitoring accuracy deteriorates.

In contrast, the backward optical multiplexer 24 in the present embodiment is designed so as to emit the stray light 54 from the side part of the output section 26. For this reason, the stray light 54 propagates through the lateral waveguide 30 connected to the side part of the output section 26. The lateral waveguide 30 outputs the stray light 54 from the side face 32. Therefore, it is possible to prevent the stray light 54 from entering the photodiode disposed on the rear end face 36 side. This can reduce fluctuations of the monitoring wavelength. Therefore, it is possible to improve the monitoring accuracy.

A structure in which the output end of the lateral waveguide for propagating stray light is provided on the side part of the rear end face may be adopted as the structure for preventing stray light from entering the photodiode. In this case, both stray light and monitoring light are emitted from the rear end face. Therefore, the position of the photodiode is limited to prevent reception of stray light. In contrast, in the present embodiment, the stray light 54 is emitted from the side face 32. Therefore, the position of the photodiode need not be limited to prevent reception of stray light 54. The degree of freedom in the arrangement of the photodiode improves in this way.

When the stray light 54 is made perpendicularly incident on the side face 32, reflected light may return to the lateral waveguide 30. In contrast, in the present embodiment, the lateral waveguide 30 outputs the stray light 54 diagonally to the side face 32. Therefore, when the stray light 54 is reflected by the side face 32, it is possible to prevent the reflected light from returning to the lateral waveguide 30. This prevents returning light from returning to the backward optical multiplexer 24. Therefore, it is possible to further improve the monitoring accuracy.

In the present embodiment, the output end 31 of the lateral waveguide 30 is disposed inside the side face 32. Since the output end 31 of the lateral waveguide 30 is disposed inside the side face 32, reflection of the stray light 54 by the side face 32 is restricted. This prevents returning light from returning to the backward optical multiplexer 24. It is thereby possible to further improve the monitoring accuracy.

The lateral waveguide 30 in the present embodiment is disposed with the spacing W provided between itself and the main waveguide 28, which is equal to or greater than the width of the output light of the backward optical multiplexer 24. In such a configuration, a beam profile of light propagating through the lateral waveguide 30 does not overlap with a beam profile of light propagating through the main waveguide 28. This restricts the propagation of the stray light 54 through the main waveguide 28. This further restricts the stray light 54 from entering the photodiode, and can further improve the monitoring accuracy.

Furthermore, as described above, the photodiode receives the monitoring light 52 passing through the optical filter and detects intensity of the monitoring light 52. A frequency characteristic of transmittance of the optical filter fluctuates depending on an angle of incidence of light on the optical filter. Therefore, when the angle of incidence of the monitoring light 52 on the optical filter is shifted, intensity of the light detected by the photodiode is shifted. In the present embodiment, the main waveguide 28 is disposed at the center of the output section 26. This structure allows the shift of the angle of incidence of the monitoring light 52 on the optical filter to be restricted, and can further improve the monitoring accuracy.

Furthermore, as shown in FIG. 3, in the present embodiment, the lateral waveguide 30 is provided with the light absorption layer 74. The light absorption layer 74 absorbs the stray light 54 generated from the output section 26 of the backward optical multiplexer 24. Therefore, since the lateral waveguide 30 absorbs the stray light 54, it is possible to restrict fluctuations of the monitoring wavelength. Thus, it is possible to further improve the monitoring accuracy.

It is assumed in the present embodiment that the first waveguides 14, the second waveguide 18, the third waveguides 22 and the backward waveguides 29 are arranged at equal intervals at the input sections 15 and 27 or the output sections 17 and 26, but these waveguides may not be arranged at equal intervals. It is also assumed in the present embodiment that the main waveguide 28 and the second waveguide 18 have a linear shape, but these waveguides may not have a linear shape.

In the present embodiment, the lateral waveguide 30 is provided on the backward output light side of the semiconductor laser 12. The lateral waveguide 30 may be provided on the forward output light side as a modification. In this case, a plurality of waveguides are connected to the output section 17 of the forward optical multiplexer 16. Of the plurality of waveguides connected to the output section 17, one disposed at the center becomes the second waveguide 18 for propagating the signal light 50. The lateral waveguides 30 disposed on both sides of the second waveguide 18 propagate stray light outputted from the output section 17. This modification can prevent stray light from mixing with the signal light 50.

In the present embodiment, the lateral waveguide 30 outputs the stray light 54 diagonally to the side face 32, In the present embodiment, the stray light 54 is outputted diagonally to the side face 32 in a plan view. As a modification, the direction in which the lateral waveguide 30 outputs the stray light 54 may be any direction except a direction perpendicular to the side face 32. For example, when the semiconductor device 100 is seen from the rear end face 36 side, the lateral waveguide 30 may be formed diagonally with respect to the side face 32. In this case, the lateral waveguide 30 is formed such that the output end 31 is oriented toward the top surface or back of the semiconductor device 100.

These modifications are applicable, as appropriate, to a semiconductor device according to the following embodiment, Note that since the semiconductor device according to the following embodiment has many points common to the first embodiment, the following description will be given focused on differences from the first embodiment.

Embodiment 2

Figure 4:
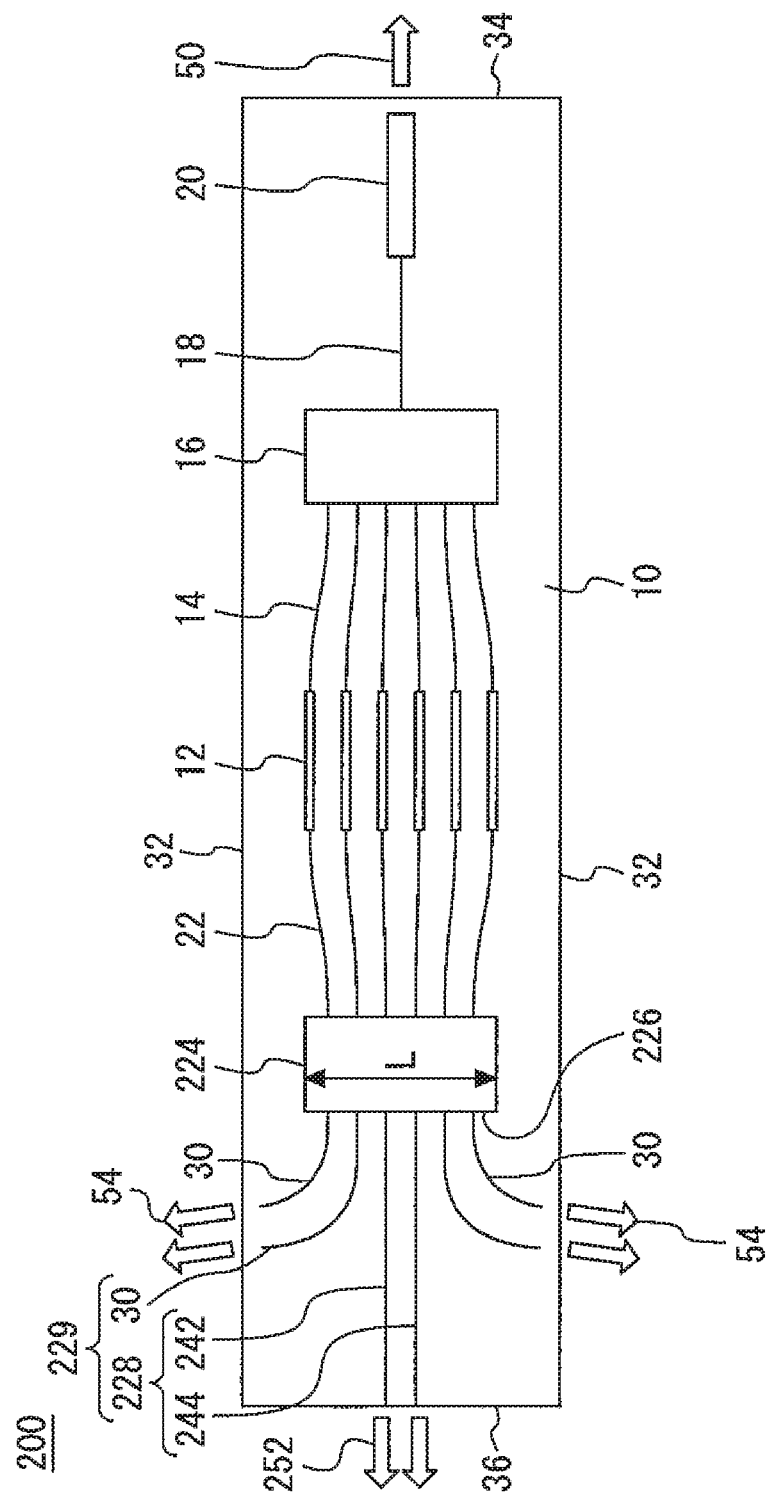
FIG. 4 is a plan view of a semiconductor device according to a second embodiment of the present invention.

FIG. 4 is a plan view of a semiconductor device according to a second embodiment of the present invention. A semiconductor device 200 according to the present embodiment is provided with a backward optical multiplexer 224. The backward optical multiplexer 224 is of a 16×6-MMI type provided with six output ports for 16 inputs from the third waveguides 22. One end of the backward waveguide 229 is connected to each output port. The semiconductor device 200 according to the present embodiment is provided with six backward waveguides 229.

The six backward waveguides 229 include a first main waveguide 242 and a second main waveguide 244. The first main waveguide 242 and the second main waveguide 244 have a linear shape. The second main waveguide 244 is provided at a position away from and parallel to the first main waveguide. The first main waveguide 242 and the second main waveguide 244 propagate monitoring light 252 to monitor the signal light 50. The first main waveguide 242 and the second main waveguide 244 output the monitoring light 252 from the rear end face 36. The first main waveguide 242 and the second main waveguide 244 constitute a main waveguide 228.

Two of the six backward waveguides 229 constitute the main waveguide 228 to propagate the monitoring light 252 in the present embodiment. The remaining four of the six backward waveguides 229 are lateral waveguides 30. Similarly to the first embodiment, the four lateral waveguides 30 are arranged on each of both sides of the main waveguide 228 in the same number. It is assumed in the present embodiment that the number of backward waveguides 229 is six, but the number of backward waveguides 229 may be any number other than six as long as it is an even number equal to or greater than four. When the number of backward waveguides 229 is assumed to be N, two of the N backward waveguides 229 constitute the main waveguide 228. For this reason, (N−2)/2 of the lateral waveguides 30 are arranged on each of both sides of the main waveguide 228. The rest of the structure is similar to that of the first embodiment.

Hereinafter, an arrangement of the main waveguide 228 will be described. A width of an output section 226 of the backward optical multiplexer 224 is assumed to be L. The number of the backward waveguides 229 is assumed to be N. Note that N is an even number equal to or greater than 4. The N backward waveguides 229 are arranged symmetrically centered on a position of L/2 from an end of the output section 226 of the backward optical multiplexer 224 and at an interval of L/N. The first main waveguide 242 and the second main waveguide 244 out of the N backward waveguides 229 are arranged symmetrically centered on the position of L/2 from the end. Furthermore, the first main waveguide 242 and the second main waveguide 244 are arranged adjacent to each other. The first main waveguide 242 and the second main waveguide 244 are arranged at positions symmetric with respect to the aforementioned optical filter.

The semiconductor device 200 according to the present embodiment is provided with the first main waveguide 242 and the second main waveguide 244. The first main waveguide 242 and the second main waveguide 244 propagate monitoring light 252. As described above, the frequency characteristic of transmittance of the optical filter fluctuates depending on the angle of incidence of light on the optical filter. In the present embodiment, the first main waveguide 242 and the second main waveguide 244 are arranged symmetrically with respect to the optical filter. At this time, the monitoring light 252 propagating through the first main waveguide 242 and the monitoring light 252 propagating through the second main waveguide 244 are incident on the optical filter at angles having the same absolute value and opposite polarities.

Therefore, both the monitoring light 252 propagating through the first main waveguide 242 and the monitoring light 252 propagating through the second main waveguide 244 are incident on the optical filter, and variations in frequency of the monitoring light 252 passing through the optical filter can be canceled out. Thus, it is possible to reduce variations of frequency of the monitoring light 52 received by the photodiode. For this reason, it is possible to further improve the monitoring accuracy.

Note that technical features described in the respective embodiments may be used in combination as appropriate.

In the semiconductor device according to the present invention, stray light propagates through the lateral waveguides. The lateral waveguides output light from side faces of the substrate diagonally to the side faces. On the other hand, monitoring light propagates through the main waveguide and is emitted from the rear end face. This eliminates the necessity to adjust the position of the photodiode on the rear end face side to prevent reception of stray light. Therefore, it is possible to improve the degree of freedom in the arrangement of the photodiode.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-127707, filed on Jun. 28, 2016 including specification, claims, drawings and summary, on which the Convention priority of the present application is based, are incorporated herein by reference in its entirety.

The invention claimed is:

1. A semiconductor device comprising:
    a substrate comprising a front end face, a rear end face and side faces disposed on both sides of the front end face and the rear end face;
    a plurality of semiconductor lasers provided on the substrate;
    a forward optical multiplexer provided on the substrate to multiplex forward output light of the plurality of semiconductor lasers and output the multiplexed light to the front end face;
    a backward optical multiplexer provided on the substrate to multiplex backward output light of the plurality of semiconductor lasers and output the multiplexed light to the rear end face; and
    a plurality of backward waveguides provided on the substrate and connected to an output section of the backward optical multiplexer,
    wherein the plurality of backward waveguides comprise:
    a main waveguide disposed at a center of the output section; and
    a plurality of lateral waveguides disposed on both sides of the main waveguide to bend toward the side faces and output light from the side faces diagonally to the side faces.

2. The semiconductor device according to claim 1, wherein output ends of the plurality of lateral waveguides are disposed inside the side faces.

3. The semiconductor device according to claim 1, wherein the main waveguide has a linear shape.

4. The semiconductor device according to claim 1,
    wherein the main waveguide comprises:
    a first main waveguide; and a second main waveguide provided at a position away from and parallel to the first main waveguide.

5. The semiconductor device according to claim 1, wherein the plurality of lateral waveguides are disposed with a spacing equal to or greater than a width of output light of the backward optical multiplexer between the plurality of lateral waveguides and the main waveguide.

6. The semiconductor device according to claim 1,
wherein the plurality of lateral waveguides are provided on each of both sides of the main waveguide in the same number, and
the plurality of backward waveguides are arranged at equal intervals.

7. The semiconductor device according to claim 1,
wherein the substrate contains InP,
the plurality of lateral waveguides comprise:
an InP-containing lower clad layer disposed on the substrate;
an InGaAsP-containing light absorption layer disposed on the lower clad layer;
an InP-containing current block layer disposed on both sides of the light absorption layer on the lower clad layer; and
an InP-containing upper clad layer disposed on the light absorption layer and the current block layer.

* * * * *